(12) United States Patent
Wu et al.

(10) Patent No.: US 7,220,647 B2
(45) Date of Patent: May 22, 2007

(54) METHOD OF CLEANING WAFER AND METHOD OF MANUFACTURING GATE STRUCTURE

(75) Inventors: Chih-Ning Wu, Hsinchu (TW); Charlie C J Lee, Hsinchu Hsien (TW); Kuan-Yang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 101 days.

(21) Appl. No.: 11/050,261

(22) Filed: Feb. 2, 2005

(65) Prior Publication Data
US 2006/0172548 A1    Aug. 3, 2006

(51) Int. Cl.
*H01L 21/336* (2006.01)
*H01L 21/302* (2006.01)
*H01L 21/461* (2006.01)

(52) U.S. Cl. ............... 438/297; 438/745; 257/E21.316; 257/E21.29; 257/E21.277

(58) Field of Classification Search ................ 438/592, 438/745, 297
See application file for complete search history.

(56) References Cited

U.S. PATENT DOCUMENTS

| | | | | |
|---|---|---|---|---|
| 5,464,782 A | * | 11/1995 | Koh ........................... | 438/303 |
| 6,431,183 B1 | * | 8/2002 | Konishi et al. ............... | 134/1.3 |
| 6,562,144 B2 | * | 5/2003 | Chang ........................ | 134/21 |
| 6,828,205 B2 | * | 12/2004 | Tsai et al. .................... | 438/313 |
| 6,835,668 B2 | * | 12/2004 | Andreas et al. ............. | 438/745 |
| 6,858,524 B2 | * | 2/2005 | Haukka et al. .............. | 438/585 |
| 7,132,360 B2 | * | 11/2006 | Schaeffer et al. ........... | 438/622 |
| 2005/0167778 A1 | * | 8/2005 | Kim et al. ................... | 257/510 |
| 2006/0011996 A1 | * | 1/2006 | Wu et al. .................... | 257/412 |
| 2006/0099783 A1 | * | 5/2006 | Gluschenkov et al. ...... | 438/585 |

\* cited by examiner

*Primary Examiner*—Walter Lindsay, Jr.
*Assistant Examiner*—Thu-Huong Dinh
(74) *Attorney, Agent, or Firm*—J.C. Patents

(57) ABSTRACT

A method of cleaning a wafer, adapted for a patterned gate structure. The gate structures comprise a gate dielectric layer, a nitrogen-containing barrier layer and a silicon-containing gate layer sequentially stacked over the substrate. The method includes cleaning the substrate with phosphoric acid solution and hydrofluoric acid solution so that silicon nitride residues formed in a reaction between the nitrogen-containing barrier layer and the silicon-containing gate layer can be removed and the amount of pollutants and particles can be reduced. Ultimately, the yield of the process as well as the quality and reliability of the device are improved.

23 Claims, 4 Drawing Sheets

METHOD OF CLEANING WAFER AND METHOD OF MANUFACTURING GATE STRUCTURE

BACKGROUND OF THE INVENTION

1. Field of the Invention

The present invention relates to a semiconductor fabrication process. More particularly, the present invention relates to a method of cleaning wafers and a method of manufacturing gate structures on wafers.

2. Description of the Related Art

In the current semiconductor fabricating process, cleaning the wafer is one of the most important and frequent steps. The purpose of cleaning the wafer is to remove residues such as particles, organics or inorganic metallic ions from the surface. Hence, wafer cleaning is one of the critical factors affecting the yield as well as the quality and reliability of a device.

On the other hand, the fabrication of gate structures on a wafer is also an important process in the semiconductor fabricating process. The quality of the gate structures directly affects the subsequent yield, reliability and performance of a device. Therefore, how to achieve a high degree of cleanliness in the wafer to form a high-quality gate structures is a task to be dealt with.

The conventional technique of fabricating a gate structure includes providing a substrate having a gate dielectric layer (with a high dielectric constant K), a titanium nitride barrier layer and a polysilicon gate layer sequentially stacked thereon and then patterning these film layers to form a gate structure. Thereafter, hydrofluoric acid (HF), a mixture of hydrofluoric acid and hydrogen peroxide ($HF/H_2O_2$) or a fluorine-containing organic solvent is used to clean the surface of the substrate and remove any residues.

However, in the process of patterning the gate structure, along with the normal list of particles and pollutants, residual material from the removed polysilicon gate layer and the titanium nitride barrier layer may react to form silicon nitride residues. These silicon nitride residues may end up on the surface of the gate dielectric layer. When the gate dielectric layer is patterned, these silicon nitride residues may act as a mask over a portion of the gate dielectric layer such that the blocked area cannot be etched completely, leaving the gate dielectric residues. It should be noted that the gate dielectric residues are difficult to remove even with another cleaning operation because the residues are covered with silicon nitride residue. FIG. 3 is a photo of a portion of the surface of a silicon wafer taken by a scanning electron microscope (SEM) after performing a gate structure patterning and a conventional cleaning process. As shown in FIG. 3, a lot of white spots can be observed, which represent the residual materials 301 on the wafer. In other words, some silicon nitride residues and gate dielectric material remain on the wafer after the cleaning operation. As a result, these residues on the wafer will affect the quality and reliability of the subsequently formed devices.

SUMMARY OF THE INVENTION

Accordingly, one objective of the present invention is to provide a method of cleaning a wafer. The method is capable of removing residues on the surface of the wafer and improving overall yield of the wafer.

Another objective of the present invention is to provide a method of fabricating gate structures on a wafer in which residues on the wafer can be efficiently removed to improve the quality and reliability of devices.

To achieve these and other advantages and in accordance with the purpose of the invention, as embodied and broadly described herein, the invention provides a method of cleaning a wafer after patterning out gate structures on the wafer. The gate structure comprises a gate dielectric layer, a nitrogen-containing barrier layer and a silicon-containing gate layer sequentially stacked over a substrate. The method includes cleaning the substrate with phosphoric acid solution and hydrofluoric acid solution.

The present invention also provides a method of fabricating gate structures on a wafer. First, a gate dielectric layer is formed over a substrate. Thereafter, a nitrogen-containing barrier layer is formed over the gate dielectric layer. Then, a silicon-containing gate layer is formed over the nitrogen-containing barrier layer. After that, the silicon-containing gate layer, the nitrogen-containing barrier layer and the gate dielectric layer are patterned to form a stack structure. Finally, the substrate is cleaned using phosphoric acid solution and hydrofluoric acid solution.

According to one embodiment of the present invention, the method of cleaning the wafer or the substrate after forming the gate structure includes washing the wafer or substrate with a solution mixture of phosphoric acid and hydrofluoric acid or with phosphoric acid solution followed by hydrofluoric acid solution or with hydrofluoric acid solution, then phosphoric acid solution and finally hydrofluoric acid solution. In the hydrofluoric acid solution, the ratio between water and hydrofluoric acid is between 1000:1 to 10000:1. In addition, the phosphoric acid solution is heated to a temperature of about 160° C. Furthermore, the gate dielectric layer is fabricated using a high dielectric constant (high K) material. The gate dielectric layer is a hafnium dioxide ($HfO_2$), nitrogen doped hafnium dioxide, nitrogen and oxygen doped hafnium dioxide or silicon doped hafnium dioxide layer, for example. The gate dielectric layer is formed, for example, by performing an atomic layer deposition (ALD) process or a metal-organic chemical vapor deposition (MOCVD) process. The nitrogen-containing barrier layer is a titanium nitride layer and the silicon-containing gate layer is a polysilicon or a doped polysilicon layer, for example.

In the present invention, phosphoric acid solution and hydrofluoric acid solution are used to clean the substrate. Since phosphoric acid solution is effective in removing the silicon nitride residues formed in a reaction between the nitrogen-containing barrier layer and the silicon-containing gate layer, the gate dielectric layer residues retained due to the overlying silicon nitride residues can be avoided. Consequently, the yield of the wafer as well as the quality and reliability of the devices within the wafer can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
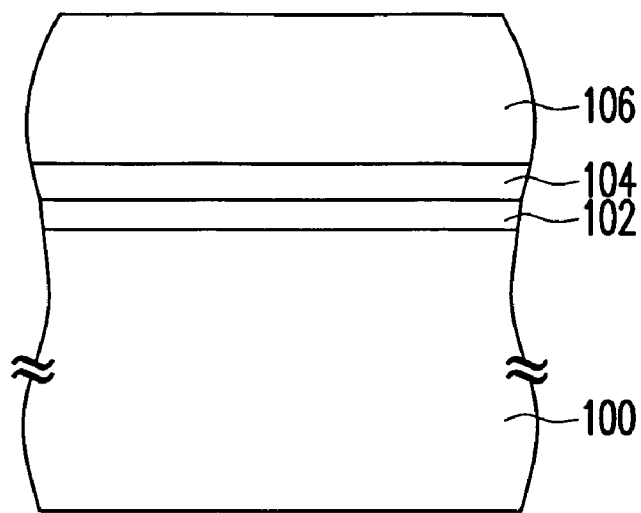
FIGS. 1A through 1D are schematic cross-sectional views showing the steps for fabricating a gate structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps for fabricating a gate structure according to one embodiment of the present invention. FIG. 2 is a flowchart showing the steps carried out in FIGS. 1A through 1D. As shown in FIGS. 1A and 2, a gate dielectric layer 102 is formed over a substrate 100 (in step 200). The gate dielectric layer 102 is fabricated using a high dielectric constant material such as hafnium dioxide, nitrogen doped hafnium dioxide, nitrogen and silicon doped hafnium dioxide, silicon doped hafnium dioxide and so on. The gate dielectric layer 102 is formed, for example, by performing an atomic layer deposition (ALD) process, a metal-organic chemical vapor deposition (MOCVD) process or other suitable process.

Thereafter, a nitrogen-containing barrier layer 104 is formed over the gate dielectric layer 102 (in step 202). The nitrogen-containing barrier layer 104 is made of titanium nitride or other nitrogen-containing material formed, for example, by performing a chemical vapor deposition process, a sputtering process or other suitable process.

Next, a silicon-containing gate layer 106 is formed over the nitrogen-containing barrier layer 104 (in step 204). The silicon-containing gate layer 106 is fabricated using polysilicon, doped polysilicon or some other silicon-containing material, for example. The silicon-containing gate layer 106 is formed, for example, by performing a chemical vapor deposition process or other suitable process.

Then, the silicon-containing gate layer 106, the nitrogen-containing barrier layer 104 and the gate dielectric layer 102 and patterned to form a stack structure (in step 206). The details are discussed in the following.

Figure 1B:
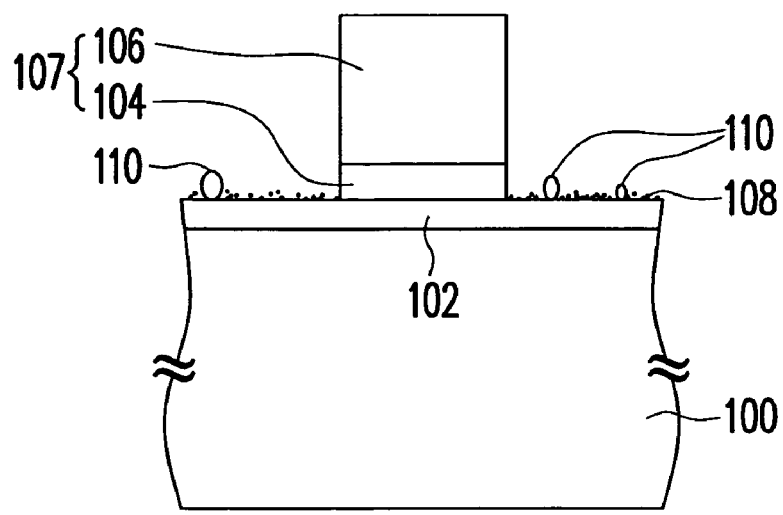
Figure 1C:
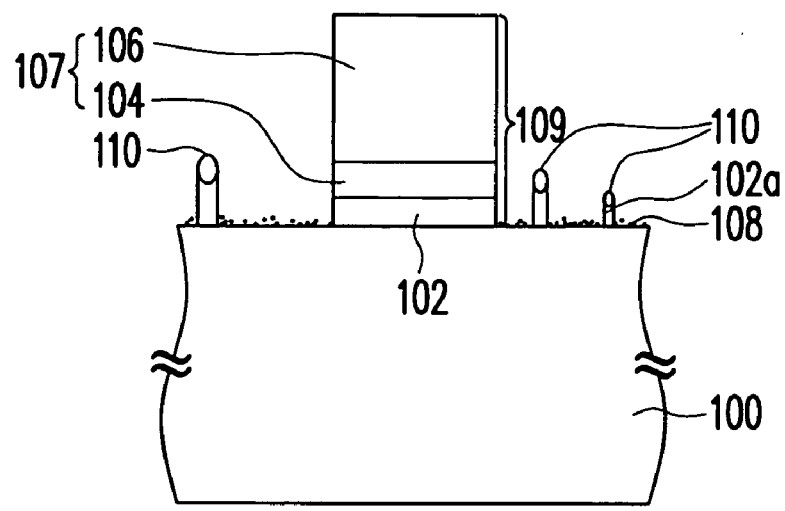
Figure 2:
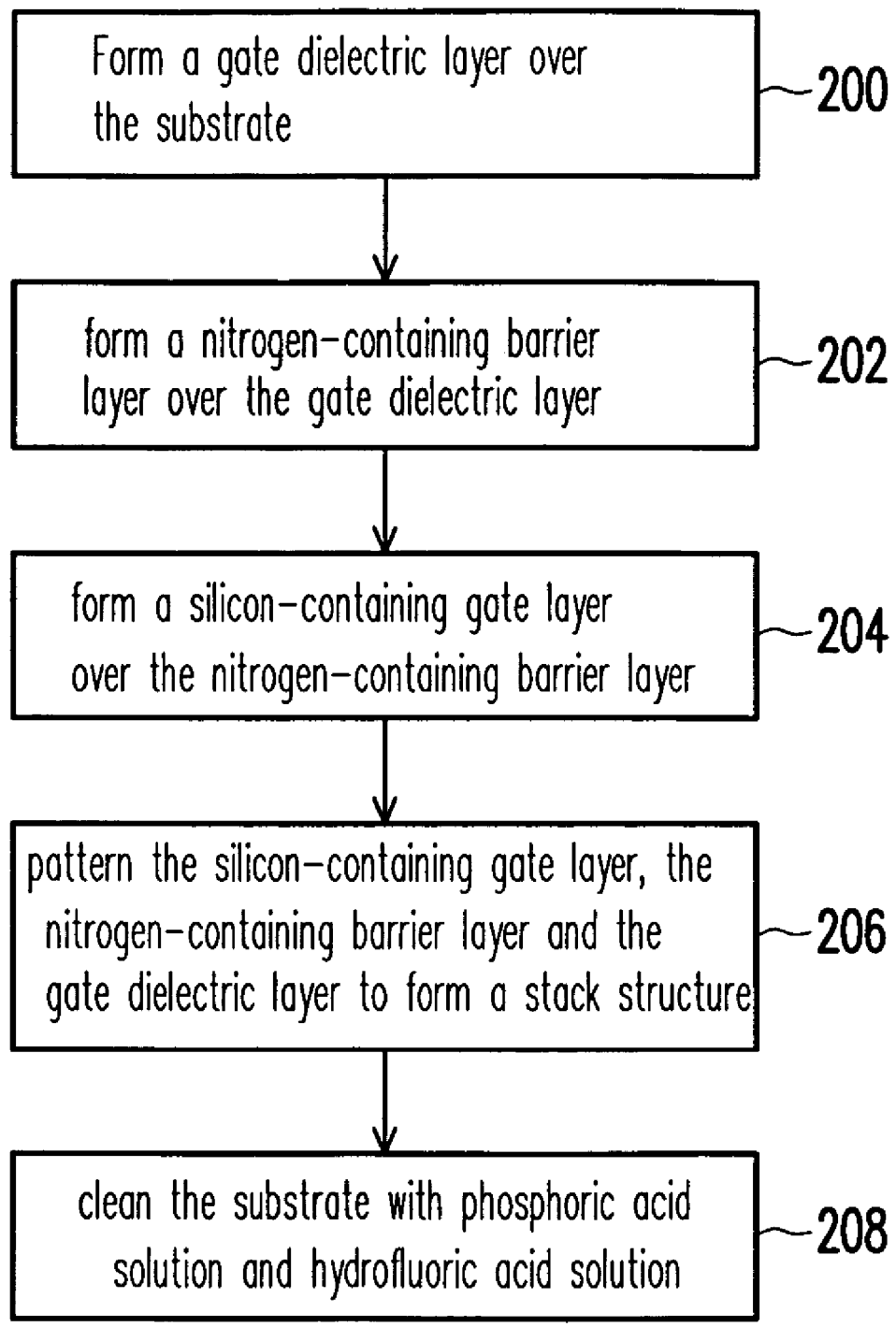
FIG. 2 is a flowchart showing the steps carried out in FIGS. 1A through 1D.

As shown in FIG. 1B, the silicon-containing gate layer 106 and the nitrogen-containing barrier layer 104 are patterned to form a stack structure 107. However, in the process of patterning the silicon-containing gate layer 106 and the nitrogen-containing barrier layer 104, along with some particles and pollutants, residues of the removed silicon-containing gate layer 106 and the nitrogen-containing barrier layer 104 may react to form some silicon nitride residues 110, which stay in the surface of the gate dielectric layer 102. Thereafter, the gate dielectric layer 102 is also patterned to form a stack structure 109 (as shown in FIG. 1C), comprising the aforementioned stack structure 107 and the gate dielectric layer 102. Since the silicon nitride residues 110 on the gate dielectric layer 102 may act as a mask to block partial area of the gate dielectric layer 102 from removal when patterned, such that the etching is incomplete and residues 102a of the gate dielectric layer 102 are retained.

Figure 1D:
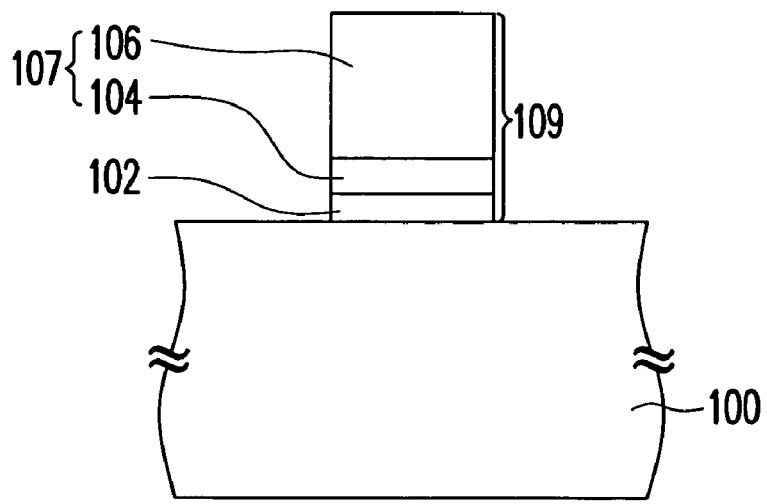

As shown in FIGS. 1D and 2, phosphoric acid solution and hydrofluoric acid solution are applied to clean the substrate 100 (in step 208) after the stack structure 109 is formed so that the residues 102a and 110 on the substrate 100 are removed. The cleaning process includes applying a solution mixture of the phosphoric acid solution and the hydrofluoric acid solution, applying hydrofluoric acid solution, phosphoric acid solution and hydrofluoric acid solution sequentially or applying phosphoric acid solution and hydrofluoric acid solution sequentially to clean the substrate. Aside from the aforementioned acid solution application sequence, the application of the phosphoric acid solution and the hydrofluoric acid solution in different order to clean the substrate is also included. In other words, the order of the solution used is not limited. In addition, the ratio between water and hydrofluoric acid in the hydrofluoric acid solution is between 1000:1 to 10000:1. Furthermore, the phosphoric acid solution is preferably heated to a temperature of about 160° C. before application.

It should be noted that the phosphoric acid solution (in step 208) used to clean the substrate is an effective means of removing the silicon nitride residues 110 formed in the reaction between the nitrogen-containing barrier layer 104 and the silicon-containing gate layer 106. In other words, the problem of not being able to remove the gate dielectric layer residues 102a with hydrofluoric acid due to the presence of overlying silicon nitride residues 110 is resolved.

Figure 3:
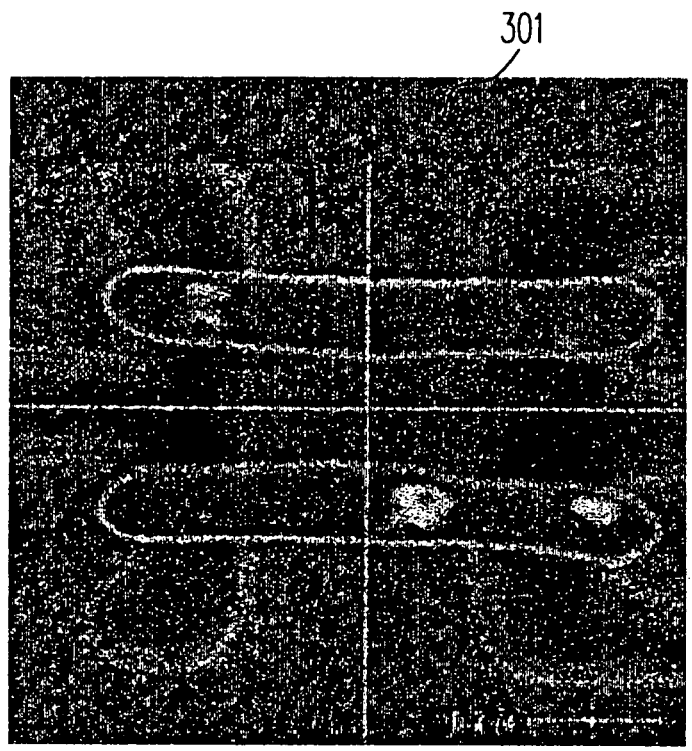
FIG. 3 is a photo of partial surface of a silicon wafer taken by a scanning electron microscope (SEM) after performing a gate structure patterning and a conventional cleaning process.
Figure 4:
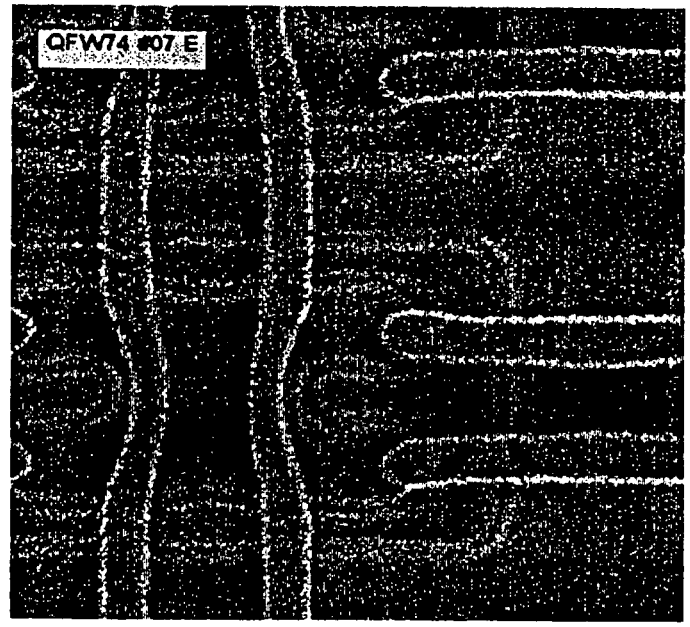
FIG. 4 is a photo of partial surface of a silicon wafer taken by a scanning electron microscope (SEM) after performing a gate structure patterning and a cleaning process according to the present invention.

After the aforementioned cleaning step (step 208), partial surface of a silicon wafer taken by a scanning electron microscope (SEM) after performing a gate structure patterning and a cleaning process is shown in FIG. 4. In FIG. 4, the white spots (residues 301) on the substrate 100 in FIG. 3 have gone. In other words, the process of cleaning the wafer according to the present invention is able to remove the silicon nitride residues 110 and the gate dielectric layer residues 102a completely.

In summary, the present invention uses phosphoric acid solution and hydrofluoric acid solution to clean and remove residues from a wafer after gate structures are formed on the wafer. In particular, compared with the conventional method, the present invention provides an effective means of removing the silicon nitride residues and gate dielectric layer residues from the wafer so that the production yield of wafer as well as the quality and reliability of the devices on the wafer is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a wafer, adapted for a patterned gate structure comprising a gate dielectric layer, a nitrogen-containing barrier layer and a silicon-containing gate layer sequentially stacked over a substrate, the method comprising removing silicon nitride residues by washing the substrate with phosphoric acid solution.

2. The cleaning method of claim 1 further comprising washing the substrate with hydrofluoric acid solution.

3. The cleaning method of claim 1, wherein the silicon nitride residues are formed by reaction between the silicon-containing gate layer and the nitriogen-containing barrier layer.

4. The cleaning method of claim 2, wherein the step of cleaning the wafer comprises washing the substrate with a solution mixture of the phosphoric acid solution and the hydrofluoric acid solution.

5. The cleaning method of claim 2, wherein the step of cleaning the wafer comprises washing the substrate with the phosphoric acid solution and then with hydrofluoric acid solution sequentially.

6. The cleaning method of claim 2, wherein the step of cleaning the wafer comprises washing the substrate with hydrofluoric acid solution, then with phosphoric acid solution and finally with hydrofluoric acid solution sequentially.

7. The cleaning method of claim 2, wherein the ratio of water to hydrofluoric acid in the hydrofluoric acid solution is between about 1000:1~10000:1.

8. The cleaning method of claim 2, wherein the phosphoric acid solution is heated to a temperature of about 160° C.

9. The cleaning method of claim 2, wherein the material constituting the gate dielectric layer comprises a high dielectric constant (high K) material.

10. The cleaning method of claim 9, wherein the high dielectric constant material comprises hafnium dioxide ($HfO_2$), nitrogen doped hafnium dioxide, nitrogen and silicon doped hafnium dioxide, or silicon doped hafnium dioxide.

11. The cleaning method of claim 2, wherein the material constituting the nitrogen-containing barrier layer comprises titanium nitride.

12. The cleaning method of claim 2, wherein the material constituting the silicon-containing gate layer comprises polysilicon or doped polysilicon.

13. A method of fabricating a gate structure, the method comprising:
   forming a gate dielectric layer over the substrate;
   forming a nitrogen-containing barrier layer over the gate dielectric layer;
   forming a silicon-containing gate layer over the nitrogen-containing barrier layer;
   patterning the silicon-containing gate layer, the nitrogen-containing barrier layer and the gate dielectric layer to form a stack structure;
   removing silicon nitride residues from the substrate by washing the substrate with phosphoric acid solution; and
   cleaning the substrate with hydrofluoric acid solution.

14. The method of claim 13, wherein the step of cleaning the substrate comprises washing the substrate with a solution mixture of the phosphoric acid solution and the hydrofluoric acid solution.

15. The method of claim 13, wherein the step of cleaning the substrate comprises washing the substrate with the phosphoric acid solution and then with hydrofluoric acid solution sequentially.

16. The method of claim 13, wherein the step of cleaning the substrate comprises washing the substrate with hydrofluoric acid solution, then with phosphoric acid solution and finally with hydrofluoric acid solution sequentially.

17. The method of claim 13, wherein the ratio of water to hydrofluoric acid in the hydrofluoric acid solution is between about 1000:1~10000:1.

18. The method of claim 13, wherein the phosphoric acid solution is heated to a temperature of about 160° C.

19. The method of claim 13, wherein the material constituting the gate dielectric layer comprises a high dielectric constant (high K) material.

20. The method of claim 19, wherein the high dielectric constant material comprises hafnium dioxide ($HfO_2$), nitrogen doped hafnium dioxide, nitrogen and silicon doped hafnium dioxide, or silicon doped hafnium dioxide.

21. The method of claim 20, wherein the step of forming the gate dielectric layer comprises performing an atomic layer deposition (ALD) process or a metal-organic chemical vapor deposition (MOCVD) process.

22. The method of claim 13, wherein the material constituting the nitrogen-containing barrier layer comprises titanium nitride.

23. The cleaning method of claim 13, wherein the material constituting the silicon-containing gate layer comprises polysilicon or doped polysilicon.

* * * * *